US011764132B2

(12) United States Patent
Iwabuchi

(10) Patent No.: US 11,764,132 B2
(45) Date of Patent: *Sep. 19, 2023

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Haruhiko Iwabuchi, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/824,877

(22) Filed: May 25, 2022

(65) Prior Publication Data

US 2022/0285250 A1  Sep. 8, 2022

Related U.S. Application Data

(63) Continuation of application No. 17/020,435, filed on Sep. 14, 2020, now Pat. No. 11,373,937.

(30) Foreign Application Priority Data

Mar. 19, 2020  (JP) ................................ 2020-049744

(51) Int. Cl.
*H01L 23/495* (2006.01)
*H01L 23/31* (2006.01)
*H01L 23/00* (2006.01)

(52) U.S. Cl.
CPC .... *H01L 23/49541* (2013.01); *H01L 23/3114* (2013.01); *H01L 23/49582* (2013.01); *H01L 24/45* (2013.01)

(58) Field of Classification Search
CPC ........... H01L 23/49541; H01L 23/3114; H01L 23/49582; H01L 24/45; H01L 23/3107; H01L 24/05; H01L 24/48; H01L 24/97
See application file for complete search history.

(56) References Cited

U.S. PATENT DOCUMENTS 8,525,305 B1 * 9/2013 Rogren ................... H01L 24/97
257/676
8,680,659 B2  3/2014 Koga et al.
(Continued)

FOREIGN PATENT DOCUMENTS

JP  2014216466 A  11/2014
JP  5968827 A  8/2016
(Continued)

*Primary Examiner* — Marc Anthony Armand
(74) *Attorney, Agent, or Firm* — Kim & Stewart LLP

(57) ABSTRACT

A semiconductor device according to an embodiment comprises a semiconductor element, a first terminal, a plurality of second terminals, and an encloser. The semiconductor element is rectangular. The first terminal has an upper surface to which a back surface of the semiconductor element is bonded. The second terminals are arranged around the first terminal. The second terminals are arranged at four corners of the encloser to be exposed from the bottom surface, and sides of the semiconductor element are opposed to the first side, the second side, the third side, and the fourth side, respectively. The first terminal is apart from the first side surface and the third side surface, a lower surface of the first terminal is exposed from the bottom surface, and the first terminal is partly exposed from the second side surface and the fourth side surface.

18 Claims, 4 Drawing Sheets

(56) References Cited

U.S. PATENT DOCUMENTS

| | | | |
|---|---|---|---|
| 10,128,434 | B2 | 11/2018 | Kigoshi et al. |
| 10,242,937 | B2 | 3/2019 | Sato et al. |
| 11,373,937 | B2 * | 6/2022 | Iwabuchi .............. H01L 21/561 |
| 2001/0045630 | A1 | 11/2001 | Ikenaga et al. |
| 2003/0189222 | A1 | 10/2003 | Itou et al. |
| 2005/0012183 | A1 | 1/2005 | Chow et al. |

FOREIGN PATENT DOCUMENTS

| | | |
|---|---|---|
| JP | 201898477 A | 6/2018 |
| JP | 2018125403 A | 8/2018 |
| JP | 2018125530 A | 8/2018 |
| WO | 2010/131706 A1 | 11/2010 |

* cited by examiner

SEMICONDUCTOR DEVICE

CROSS-REFERENCE TO RELATED APPLICATIONS

This application is a continuation of U.S. patent application Ser. No. 17/020,435, filed Sep. 14, 2020, which is based upon and claims the benefit of priority from the prior Japanese Patent Application No. 2020-049744, filed on Mar. 19, 2020 the entire contents of which are incorporated herein by reference.

FIELD

Embodiments of the present invention relate to a semiconductor device.

BACKGROUND

There is generally known a semiconductor device employing a so-called "non-leaded package" as a surface mount package, in which no lead extension from a resin package is provided and an electrode is exposed in a lower surface of the resin package. A semiconductor device adopting a non-leaded package has a structure obtained by sealing a rectangular semiconductor element together with a lead frame by a resin package.

The semiconductor device includes an island that is formed by appropriately cutting a metal lead frame patterned by etching or the like and a plurality of leads that are arranged around the island. Further downscaling is demanded for such semiconductor devices. Therefore, the leads are arranged at four corners of the resin package and the semiconductor element is generally arranged at an angle of 45 degrees with respect to the resin package.

However, in order to arrange the semiconductor element at an angle of 45 degrees with respect to the resin package, rotation or the like of the semiconductor element is required, so that there is a risk that its production efficiency is reduced.

BRIEF DESCRIPTION OF THE DRAWINGS

FIG. 3A is a bottom view of an explanatory diagram of a configuration of a semiconductor device 1a;

FIG. 3B is a top view of the semiconductor device 1a;

DETAILED DESCRIPTION

Figure 1A:
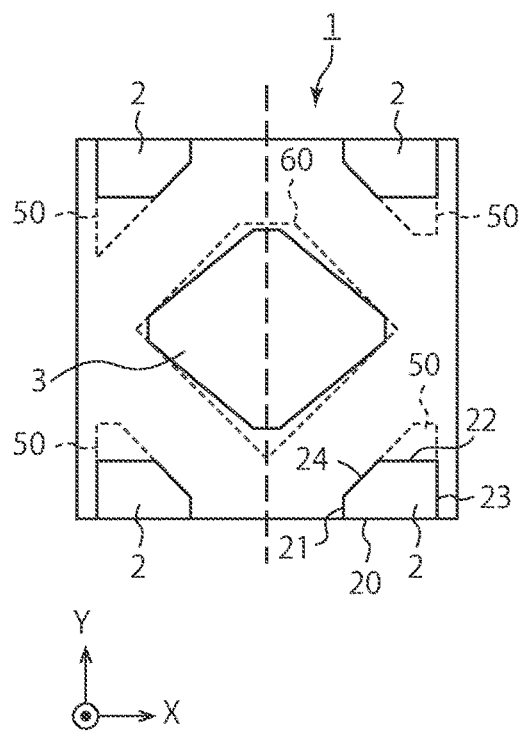
FIG. 1A is a bottom view of an explanatory diagram of a configuration of a semiconductor device 1 according to an embodiment.

A semiconductor device according to an embodiment comprises a semiconductor element, a first terminal, a plurality of second terminals, and an encloser. The semiconductor element is rectangular. The first terminal has an upper surface to which a back surface of the semiconductor element is bonded. The second terminals are arranged around the first terminal. The encloser seals a conductive line provided between a front surface of the semiconductor element and an upper surface of the second terminals, the semiconductor element, the first terminal, and the second terminals, and has a bottom surface having a rectangular shape including a first side, a second side, a third side, and a fourth side, a first side surface, a second side surface, a third side surface, and a fourth side surface that are respectively in contact with the first side, the second side, the third side, and the fourth side, where the first side surface and the third side surface are opposed to each other, and the second side surface and the fourth side surface are opposed to each other. The second terminals are arranged at four corners of the encloser to be exposed from the bottom surface, and sides of the semiconductor element are opposed to the first side, the second side, the third side, and the fourth side, respectively. The first terminal is apart from the first side surface and the third side surface, a lower surface of the first terminal is exposed from the bottom surface, and the first terminal is partly exposed from the second side surface and the fourth side surface.

A semiconductor device according to embodiments of the present invention will now be explained in detail with reference to the accompanying drawings. The embodiments described below are only examples of the embodiments of the present invention and it is not to be understood that the present invention is limited to these embodiments. In the drawings referred to in the embodiments, same parts or parts having identical functions are denoted by like or similar reference characters and there is a case where redundant explanations thereof are omitted. Further, for convenience of explanation, there are cases where dimensional ratios of the parts in the drawings are different from those of actual products and some part of configurations is omitted from the drawings.

First Embodiment

Figure 1B:
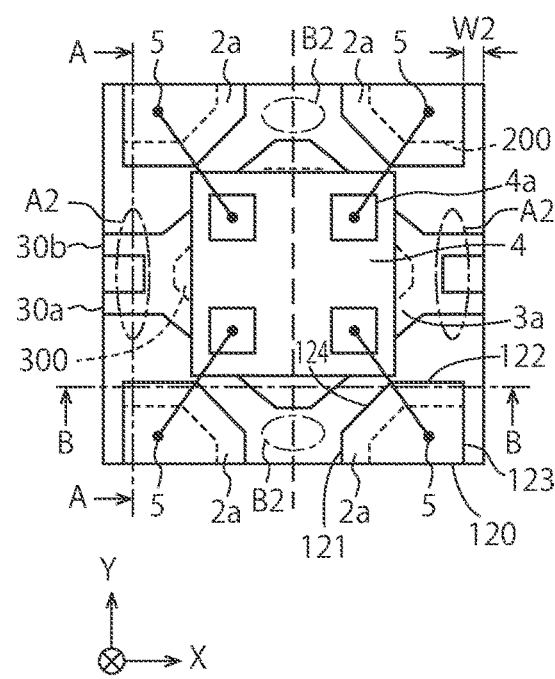
FIG. 1B is a top view of the semiconductor device according to the embodiment.
Figure 1C:
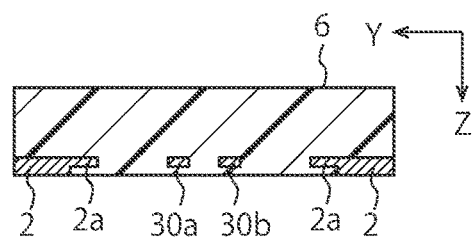
FIG. 1C is an A-A cross-sectional view of FIG. 1B.
Figure 1D:
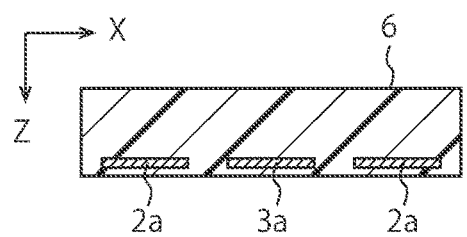
FIG. 1D is a B-B cross-sectional view of FIG. 1B.

A configuration of a semiconductor device 1 according to an embodiment is described with reference to FIGS. 1A to 1D. FIGS. 1A to 1D are explanatory diagrams of the configuration of the semiconductor device 1. FIG. 1A is a bottom view of the semiconductor device 1. FIG. 1B is a top view of the semiconductor device 1. FIG. 1C is an A-A cross-sectional view of FIG. 1B. FIG. 1D is a B-B cross-sectional view of FIG. 1B. In the present embodiment, the direction from an upper surface to a lower surface of the semiconductor device 1 is described as the Z-direction, and directions perpendicular to the Z-direction are described as the X-direction and the Y-direction.

As illustrated in FIGS. 1A to 1D, the semiconductor device 1 includes four leads 2, an island 3, a semiconductor element 4, bonding wires 5, and a resin package 6. The semiconductor device 1 is a cuboid. The size of the semiconductor device 1 is not specifically limited to any size. A broken line 50 in FIG. 1A illustrates leads 50 in a comparative example described later with reference to FIGS. 3A to 3D, and a broken line 60 illustrates a formation example of an island 60 in the comparative example described later. FIG. 1B is a top view through the resin package 6. Therefore, in practice, the upper surface of the semiconductor device 1 is covered by the resin package 6. A broken line 200 in FIG. 1B illustrates the leads 2 in FIG. 1A, and a broken line 300 illustrates a bottom-surface pattern of the island 3.

Figure 2:
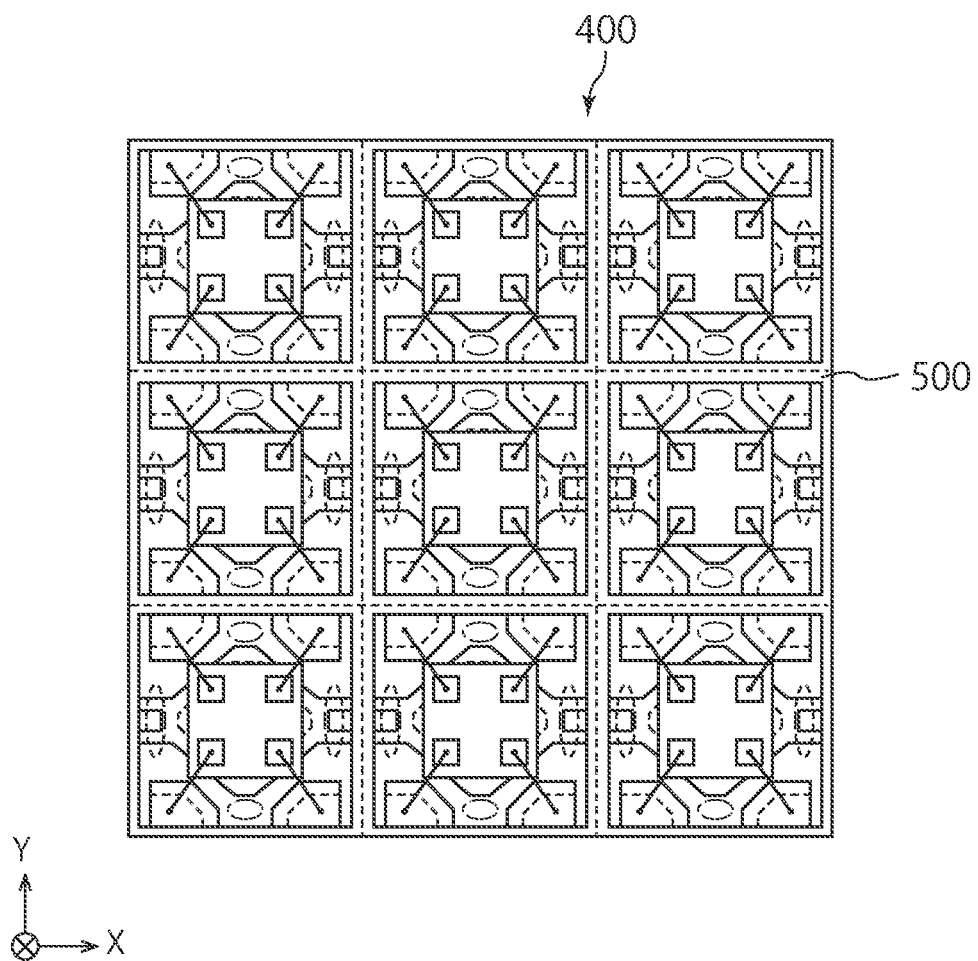
FIG. 2 is a diagram illustrating an arrangement example of a plurality of semiconductor devices 1 in a resin sealing body.

FIG. 2 is a diagram illustrating an arrangement example of a plurality of semiconductor devices 1 in a resin sealing body 400.

As illustrated in FIG. 2, the semiconductor devices 1 are arranged in the resin sealing body 400. Each of the semiconductor devices 1 is produced by cutting a lead frame 500, together with resin, in the resin sealing body 400.

The material of leads 2 and that of the island 3 are not specifically limited to any material and are Cu, for example. For example, the leads 2 and the island 3 are formed by the same metal plate and are the same as each other in the maximum thickness. The island 3 according to the present embodiment corresponds to a first terminal, the leads 2 correspond to second terminals, the bonding wire 5 corresponds to a conductive line, and the resin package 6 corresponds to an encloser.

The four leads 2 are apart from the island 3 and a semiconductor element 4. That is, in the present embodiment, the four leads 2 are arranged to be apart from the island 3 and the semiconductor element 4 while interposing the island 3 and the semiconductor element 4 therebetween. The four leads 2 are arranged at four corners of the resin package 6 in this manner. In this case, an edge portion in which the resin package 6 covers the lead 2 may be provided on a side surface of the semiconductor device 1, as indicated with an arrow W2 in FIG. 1B.

Each lead 2 includes a non-etched portion exposed from a bottom surface of the resin package 6 and a terminal half-etched portion 2a that is covered by the resin package 6 on a lower-surface side and has a thickness smaller than that of the non-etched portion. The terminal half-etched portion 2a extends from the non-etched portion towards the island 3 and the adjacent lead 2 by a predetermined length (width). The terminal half-etched portion 2a can be formed by chemical etching or pressing, for example. The material of the resin package 6 covers the terminal half-etched portion 2a to cover it.

In the present specification, the lower surface of the leads 2 and the island 3 and the shape of the lower surface represent the non-etched portion exposed from the bottom surface of the resin package 6 and the shape thereof. The shape of the leads 2 and the island 3 or the shape of the upper surface represents the shape of a portion including both the non-etched portion and the half-etched portion in plan view. In the lead 2 and the island 3, the non-etched portion and the half-etched portion smoothly continue to each other in the upper surface. The upper surface of the leads 2 and the island 3 has a shape in which the lower surface of the leads 2 and the island 3 becomes larger by a width of half-etching.

The lower surface of each lead 2 is exposed in the bottom surface of the resin package 6 except for the terminal half-etched portion 2a, and serves as an external terminal that connects to a circuit board (not illustrated).

The lower surface of each lead 2 has a pentagonal shape, and has sides 20 and 22 that are parallel to one pair of opposed sides of the semiconductor element 4 and sides 21 and 23 that are parallel to the other pair of opposed sides of the semiconductor element 4. Each lead 2 further has a side 24 that is not parallel to any side of the semiconductor element 4 and is inclined at an angle of 45 degrees, for example. The side 23 is shorter than the side 20.

The upper surface of each lead 2 has a pentagonal shape and has sides 120 and 122 parallel to one pair of opposed sides of the semiconductor element 4 and sides 121 and 123 parallel to the other pair of opposed sides of the semiconductor element 4. Each lead 2 further has a side 124 that is not parallel to any side of the semiconductor element 4 and is inclined at an angle of 45 degrees, for example. The side 123 is shorter than the side 120.

The lower surface of the island 3 has a substantially rhombic shape. The lower surface of the island 3 according to the present embodiment has a shape obtained by rounding corners of a rhombus, for example, eliminating the corners. The island 3 is formed in such a manner that each side of the rhombic shape of the lower surface of the island 3 is not parallel to each side of the resin package 6. In other words, the lower surface of the island 3 has a shape having two pairs of sides, the sides of each pair being parallel to each other. The two pairs of opposed sides of the island 3 are not parallel to any side of the resin package 6. Further, the length in the X-direction of the lower surface of the island 3 is longer than the length in the Y-direction. In the upper surface of the island 3, a portion except for portions 30a and 30b is also substantially rhombic, and the same description as that of the lower surface of the island 3 can be also applied to the upper surface.

Further, the lower surface of the island 3 is exposed in the bottom surface of the resin package 6. Furthermore, in the island 3, an island half-etched portion 3a is formed in a side surface opposed to the lead 2. The material of the resin package 6 covers the island half-etched portion 3a. In other words, the island 3 includes a non-etched portion exposed from the bottom surface of the resin package 6 and the island half-etched portion 3a that is covered by the resin package 6 on a lower-surface side and has a thickness smaller than that of the non-etched portion. The island half-etched portion 3a extends from the non-etched portion on an XY-plane by a predetermined length (width). Accordingly, the strength of bonding between the island 3 and the resin package 6 can be increased. The island half-etched portion 3a can be formed by chemical etching or pressing, for example.

The island half-etched portion 3a of the island 3 includes the suspension pin portions 30a and 30b that extend in the X-direction. As illustrated in FIG. 2, because of the connection of the suspension pin portions 30a and 30b to the lead frame 500, it is possible to prevent the island 3 from falling out from the lead frame 500. In the present embodiment, the regions 30a and 30b of the island 3 connected to the lead frame 500 adjacent thereto before cutting, as illustrated in FIG. 2, are called suspension pin portions or suspension pins. In plan view along the Z-direction, the leads 2 are arranged at respective ends of two sides of the resin package 6 which extend in the X-direction. Two spaces A2 formed between ends adjacent to each other in the Y-direction include the suspension pin portions 30a and 30b.

Meanwhile, in plan view along the Z-direction, the island 3 is apart from the two sides of the resin package 6 which extend in the X-direction. In other words, the island 3 is apart from side surfaces of the resin package 6 which are parallel to the Z-direction and the X-direction. Therefore, in plan view along the Z-direction, it is possible to provide a region B2 that is not in contact with the island 3 nor the two sides of the resin package 6 which extend in the X-direction.

In FIG. 1B, that is, in plan view along the Z-direction, points at which the suspension pin portions 30a and 30b are in contact with two opposed sides of the resin package 6 are at least two points that are apart from each other. As illustrated in FIG. 1A, a midpoint of the island 3 is located between two points of the suspension pin portions 30a and 30b in plan view.

The semiconductor element 4 (a semiconductor chip) is rectangular. The semiconductor element 4 is bonded on its back surface to the island 3 with a bonding material interposed therebetween while a front surface (a device-forming surface) on which functional elements are formed faces up. While the bonding material is a non-conductive bonding material, for example, a conductive bonding material can be also used.

An angle formed between a side of the semiconductor element 4 and a side of the resin package 6 is 20 degrees or less. More preferably, a side of the semiconductor element 4 and a side of the resin package 6 are parallel to each other. As illustrated in FIG. 1B, in plan view along the Z-direction, there is no corner of the semiconductor element 4 located between the two leads 2 adjacent to each other in the X-direction. In plan view along the Z-direction, there is a corner of the semiconductor element 4 located between the two leads 2 adjacent to each other in the Y-direction.

On the front surface of the semiconductor element 4, pads 4a corresponding to the respective leads 2 are formed. One end of the bonding wire 5 is bonded to each pad 4a. The other end of the bonding wire 5 is bonded to the upper surface of the corresponding lead 2. Accordingly, the semiconductor element 4 is electrically connected to the lead 2 via the bonding wire 5.

Figure 3A:
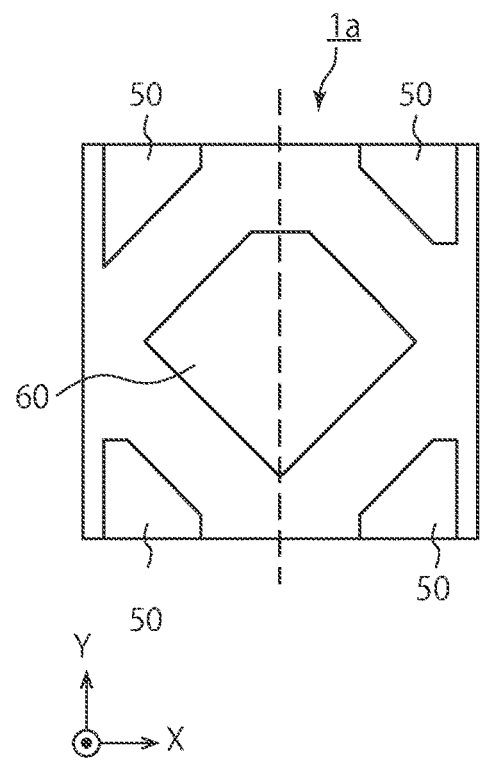
Figure 3B:
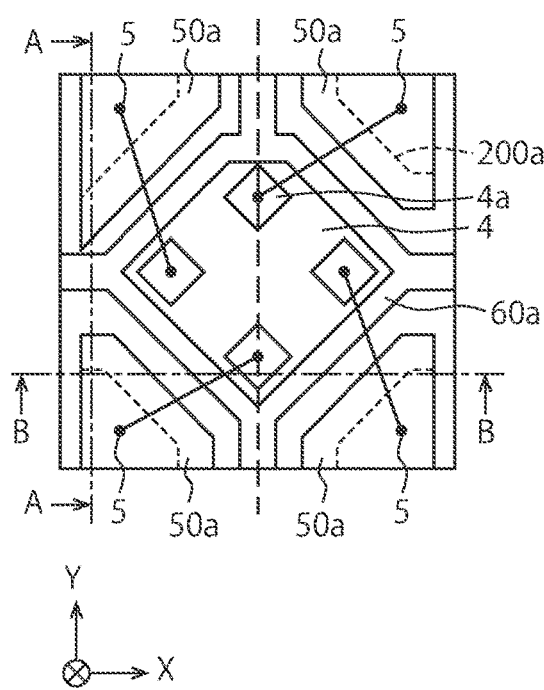
Figure 3C:
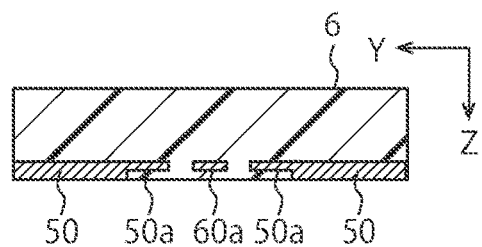
FIG. 3C is an A-A cross-sectional view of FIG. 3B.
Figure 3D:
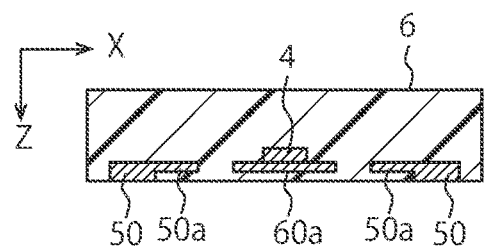
FIG. 3D is a B-B cross-sectional view of FIG. 3B.

A configuration of a semiconductor device 1a according to a comparative example of the embodiment is described with reference to FIGS. 3A to 3D. FIGS. 3A to 3D are explanatory diagrams of the configuration of the semiconductor device 1a. FIG. 3A is a bottom view of the semiconductor device 1a. FIG. 3B is a top view of the semiconductor device 1a. FIG. 3C is a cross-sectional view taken along a line A-A in FIG. 3B. FIG. 3D is a cross-sectional view taken along a line B-B in FIG. 3B.

As illustrated in FIGS. 3A to 3D, the semiconductor device 1a includes the four leads 50, the island 60, the semiconductor element 4, the bonding wires 5, and the resin package 6. The semiconductor device 1a is a cuboid. The semiconductor device 1 and the semiconductor device 1a include the semiconductor element 4 and the resin package 6. FIG. 3B is a top view through the resin package 6. Therefore, in practice, an upper surface of the semiconductor device 1a is covered by the resin package 6. A broken line 200a in FIG. 3B illustrates the lead 50 illustrated in FIG. 3A. The semiconductor element 4 has the same shape as a lower-surface pattern of the island 60, for example, and is provided directly above the lower-surface pattern of the island 60.

As illustrated in FIG. 3A, in the lower surface, one side of each lead 50 and four sides of the island 60 are arranged at a predetermined angle, for example, an angle of 45 degrees with respect to sides of the resin package 6. That is, in the lower surface, one side of each lead 50 is parallel to any side of the island 60 to be apart therefrom.

In the semiconductor device 1a according to the comparative example, a side of the semiconductor element 4 is arranged at an angle of 45 degrees with respect to a side of the resin package 6. Accordingly, the semiconductor device 1a is arranged in such a manner that the island 60 and the lead 50 each have a large area and the upper surface of the leads 50 provided at four corners of the package 6 and the lower surface of the semiconductor element 4 are apart from each other.

The semiconductor device 1a according to the comparative example is manufactured, rotation is required which arranges a side of the semiconductor element 4 at an angle of 45 degrees with respect to a side of the resin package 6. Generally, the accuracy in alignment of the semiconductor element 4 is reduced, in a case where the alignment involves rotation. In the comparative example, one of corners of the semiconductor element 4 is cut at an angle of 45 degrees and a side generated by this cutting is aligned with the X-direction, thereby increasing the accuracy of alignment in the rotation. Further, the area of the island 60 is set to be large, thereby ensuring a large margin for alignment of the semiconductor element 4. Vertices of the semiconductor element 4 that is rectangular are close to the sides of the resin package 6.

Further, the leads 50 are triangular. The lower surface of the island 60 according to the present embodiment has a shape obtained by rounding corners of a triangle, for example, eliminating the corners. A suspension pin portion of the island 60 extends toward each side of the resin package 6. Because the island 60 and each lead 50 are close to each other both in the X-direction and the Y-direction and also because the area of the island 60 is large, the possibility of short circuit is increased.

The suspension pin portions of the comparative example extend in the X-direction and the Y-direction and prevent the island 60 from being displaced or twisted while the island 60 is connected to a lead frame.

The semiconductor device 1 according to the embodiment does not include a suspension pin portion extending in the Y-direction and thus can make the region B2 large. Accordingly, it is possible to ensure a wide clearance between the side 121 of the lead 2 and the island 3 in the X-direction. Therefore, even when further downscaling proceeds, it is possible to prevent short circuit between the lead 2 and the island 3 which may be caused by metal dragging or the like, when a lead frame is cut along a line extending in the X-direction.

The island 3 of the semiconductor device 1 has a substantially rhombic shape in which the length in the Y-direction is smaller than the length in the X-direction. Therefore, in the X-direction, a distance between the island 3 and the side 24 of each lead 2 becomes larger from an end of a side surface of the resin package 6 toward a midpoint.

In the lead 2, the length in the Y-direction is shorter than the length in the X-direction. Therefore, also near the end in the X-direction of the side surface of the resin package 6, it is possible to ensure a large distance between the island 3 and the side 24 of each lead 2. Further, it is possible to make a distance between the side 22 of each lead 2 and the suspension pin portion 30a or 30b and a distance between the side 22 of each lead 2 and the back surface of the semiconductor element 4 large.

Therefore, the possibility of short circuit between the lead 2 and the island 3 or the like is further reduced. That is, a clearance is further increased. Accordingly, it is possible to further downscale the semiconductor device 1.

The suspension pin portions 30a and 30b are exposed from the resin package 6 at at least two points that are apart from each other in the Y-direction, and are connected to a lead frame. Because a suspension pin portion branches into the suspension pin portions 30a and 30b, it is possible to make a metal cut region in dicing smaller, relax the concentration of stress, and improve the package quality as compared with a case where one thick suspension pin portion is provided. Further, in a case of using a dicing blade, clogging of the dicing blade can be prevented.

In the semiconductor device 1, a side of the semiconductor element 4 and a side of the resin package 6 form an angle of 20 degrees or less therebetween or are parallel to each other. Therefore, unlike the comparative example, it is unnecessary to perform an operation of arranging the semiconductor element 4 at an angle of 45 degrees with respect to a side of the resin package 6, so that the productivity of the semiconductor device 1 is more improved. In other words, by setting the side 23 of the lead 2 to be shorter, the semiconductor device 1 is formed to be arrangeable without arranging a side of the semiconductor element 4 at an angle of 45 degrees with respect a side of the resin package 6.

Further, in the semiconductor device 1, it is possible to ensure a large distance between the semiconductor element 4 and a side surface of the resin package 6. Therefore, stress applied to the semiconductor element 4 when the resin package 6 is cut can be made small.

As described above, according to the present embodiment, the leads 2 are arranged at four corners of the resin package 6, and an angle formed between a side of the semiconductor element 4 and a side of the resin package 6 is set to 20 degrees or less. Accordingly, a distance between a vertex of the semiconductor element 4 and a side of the resin package 6 becomes longer, the possibility of short circuit between the island 3 and each lead 2 is further reduced, and the semiconductor device 1 can be further downscaled. In addition, it is unnecessary to perform an operation of arranging the semiconductor element 4 at an angle of 45 degrees with respect to a side of the resin package 6, so that the productivity of the semiconductor device 1 is further improved.

Further, the island half-etched portion 3a of the island 3 includes the suspension pin portions 30a and 30b that extend in the X-direction and are exposed from a side surface of the resin package 6 in plan view along the Z-direction, and is formed to be apart from the side surface of the resin package 6 in the Y-direction. Accordingly, it is possible to prevent the island 3 from falling out from a lead frame, and it is also possible to provide the region B2 that is not in contact with the island 3 nor the side surface of the resin package 6. In this manner, the semiconductor device 1 can be further downscaled, and the productivity of the semiconductor device 1 is also further improved.

Modification of Embodiment

A semiconductor device 1b according to a modification of the embodiment is different from the semiconductor device 1 according to the embodiment in that suspension pin portions 32 and 34 of the island 3 are arranged to be offset from midpoints of sides of the resin package 6, which are opposed to the suspension pin portions 32 and 34, to left and right, that is, to opposite directions to each other.

Figure 4A:
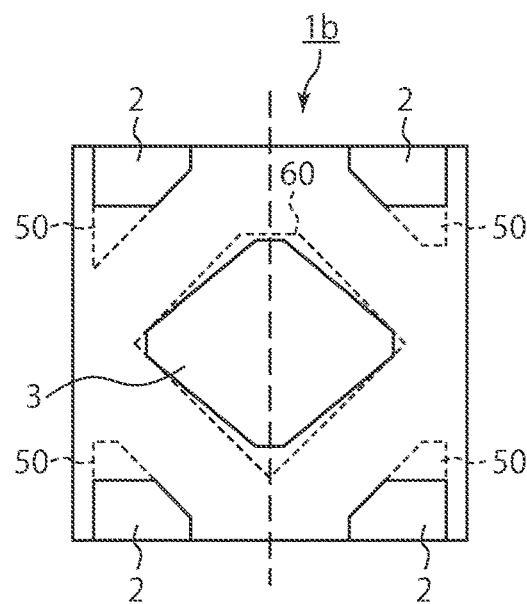
FIG. 4A is a bottom view of an explanatory diagram of a configuration of a semiconductor device 1b.
Figure 4B:
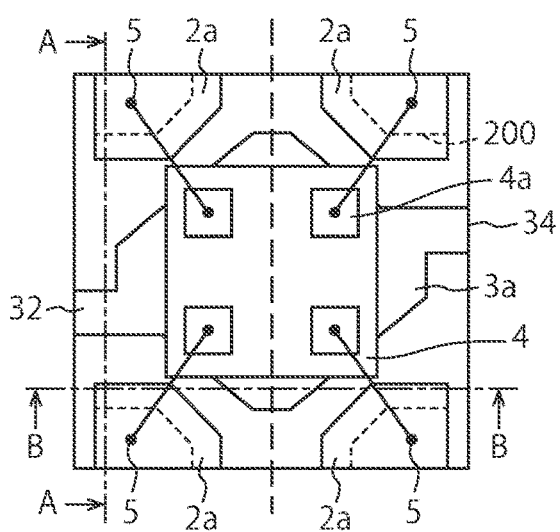
FIG. 4B is a top view of the semiconductor device 1b.
Figure 4C:
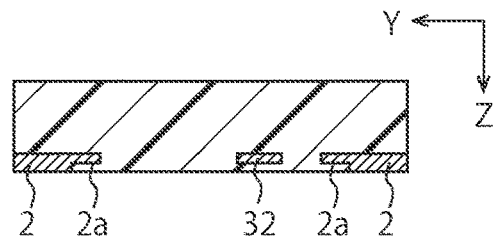
FIG. 4C is an A-A cross-sectional view of FIG. 4B.
Figure 4D:
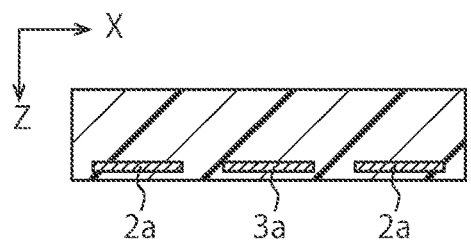
FIG. 4D is a B-B cross-sectional view of FIG. 4B.

FIGS. 4A to 4D are explanatory diagrams of a configuration of the semiconductor device 1b according to the modification of the embodiment. FIG. 4A is a bottom view of the semiconductor device 1b. FIG. 4B is a top view of the semiconductor device 1b. FIG. 4C is a cross-sectional view taken along a line A-A in FIG. 4B. FIG. 4D is a cross-sectional view taken along a line B-B in FIG. 4B. The suspension pin portions 32 and 34 of the island 3 are arranged to be offset from midpoints of sides of the resin package 6, which are opposed to the suspension pin portions 32 and 34, to left and right, that is, to opposite directions to each other. Therefore, it is possible to reduce twisting with the suspension pin portions 32 and 34.

Although the semiconductor device 1 described in the present specification has been described as a semiconductor device including the semiconductor element 4 mounted on a lead frame, the semiconductor device 1 may be also a so-called "lead-frameless type" in which the semiconductor element 4 is mounted on a substrate or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a rectangular semiconductor element;
a first terminal having an upper surface to which a back surface of the semiconductor element is bonded;
a plurality of second terminals arranged around the first terminal; and
an encloser, wherein
a conductive line is provided between a front surface of the semiconductor element and an upper surface of the second terminals,
the semiconductor element, the first terminal, and the second terminals are sealed by the encloser,
the encloser has a bottom surface having a rectangular shape including first, second, third, and fourth sides and first, second, third, and fourth side surfaces that are respectively in contact with the first, second, third, and fourth sides, and
the first and third side surfaces are opposed to each other, and the second and fourth side surfaces are opposed to each other, wherein
the second terminals are arranged at four corners of the encloser to be exposed through the bottom surface of the encloser,
a lower surface of the first terminal is exposed through the bottom surface of the encloser, and the first terminal is partly exposed through the second and fourth side surfaces, and
the lower surface of the first terminal has at least two pairs of opposed sides that are parallel to each other, none of the sides of the two pairs being parallel to any of the first, second, third, and fourth sides of the bottom surface of the encloser.

2. The device of claim 1, wherein sides of the semiconductor element are parallel to the first, second, third, and fourth sides of the bottom surface of the encloser, respectively.

3. The device of claim 1, wherein the first terminal includes an island portion bonded to the semiconductor element and a suspension pin portion extending from the island portion and being exposed through the second and fourth side surfaces.

4. The device of claim 3, wherein the suspension pin portion is exposed through the second and fourth side surfaces at points that are respectively apart from a midpoint of the second side and a midpoint of the fourth side in respective directions in which the second and fourth sides extend.

5. The device of claim 1, wherein in plan view of the bottom surface, a midpoint of each side of the bottom surface is not included in an exposed portion of the first terminal exposed through the second and fourth side surfaces.

6. The device of claim 1, wherein a length of the second terminal in a direction parallel to the first side is longer than a length of the second terminal in a direction parallel to the second side.

7. The device of claim 1, wherein the first terminal includes a first portion exposed through the bottom surface and a second portion that is provided around the first portion, is covered by the encloser, and is thinner than the first portion.

8. The device of claim 7, wherein the first terminal further includes a suspension pin portion extending from the second portion and being exposed through the second and fourth side surfaces.

9. The device of claim 2, wherein the first terminal includes an island portion bonded to the semiconductor element and a suspension pin portion that extends from the island portion and is exposed through the second and fourth side surfaces.

10. The device of claim 1, wherein the second terminal includes a third portion exposed through the bottom surface and a fourth portion that is provided around the third portion, is covered by the encloser, and is thinner than the third portion.

11. The device of claim 1, wherein the upper surface of the second terminal is pentagonal and has two sides parallel to one pair of opposed sides of the semiconductor element, two sides parallel to the other pair of opposed sides of the semiconductor element, and a side parallel to one side of the upper surface of the first terminal.

12. The device of claim 1, wherein the lower surface of the second terminal is pentagonal and has two sides parallel to one pair of opposed sides of the semiconductor element, two sides parallel to the other pair of opposed sides of the semiconductor element, and a side being not parallel to one side of the lower surface of the first terminal, the one side of the lower surface of the first terminal opposed to the side.

13. The device of claim 1, wherein the lower surface of the second terminal is pentagonal and has two sides parallel to one pair of opposed sides of the semiconductor element, two sides parallel to the other pair of opposed sides of the semiconductor element, and a side that is not parallel to any side of the semiconductor element and is inclined at an angle of 45 degrees with respect to one side of the semiconductor element.

14. The device of claim 1, wherein the encloser includes an edge portion in a side surface, the encloser covering the second terminal in the edge portion.

15. The device of claim 1, wherein a surface of the second terminal exposed through the bottom surface is to be connected to a circuit board.

16. The device of claim 1, wherein the first terminal and the second terminal are formed of a same metal plate.

17. The device of claim 1, wherein a material of the first terminal and that of the second terminal are copper.

18. The device of claim 1, wherein a corner of the rectangular semiconductor element protrudes from the upper surface of the first terminal in a direction parallel to the upper surface of the first terminal.

* * * * *